(12) United States Patent
Lin et al.

(10) Patent No.: US 9,064,776 B2
(45) Date of Patent: Jun. 23, 2015

(54) RADIATION HARDENED TRANSISTORS BASED ON GRAPHENE AND CARBON NANOTUBES

(71) Applicant: International Business Machines Corporation, Armonk, NY (US)

(72) Inventors: Yu-Ming Lin, West Harrison, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 13/966,385

(22) Filed: Aug. 14, 2013

(65) Prior Publication Data
US 2013/0320303 A1   Dec. 5, 2013

Related U.S. Application Data

(62) Division of application No. 13/006,081, filed on Jan. 13, 2011, now Pat. No. 8,546,246.

(51) Int. Cl.
*H01L 29/16*     (2006.01)
*H01L 21/02*     (2006.01)
(Continued)

(52) U.S. Cl.
CPC .......... *H01L 29/16* (2013.01); *H01L 21/02378* (2013.01); *H01L 21/02381* (2013.01); *H01L 21/0242* (2013.01); *H01L 21/02488* (2013.01); *H01L 21/02527* (2013.01); *H01L 21/02656* (2013.01); *H01L 29/66742* (2013.01); *H01L 29/78603* (2013.01); *H01L 29/78684* (2013.01); *H01L 29/1606* (2013.01)

(58) Field of Classification Search
CPC .............. H01L 29/16; H01L 21/02378; H01L 21/0231; H01L 21/0242; H01L 21/02488; H01L 21/02527; H01L 21/02656; H01L 29/66742; H01L 29/78603; H01L 29/78684; H01L 29/1606
See application file for complete search history.

(56) References Cited

U.S. PATENT DOCUMENTS 5,030,580 A    7/1991   Furukawa et al.
5,156,784 A   10/1992   Fuentes
(Continued)

OTHER PUBLICATIONS

Tsutsui et al., "Mobility and Threshold-Voltage Comparison Between (110)- and (100)-Oriented Ultrathin-Body Silicon MOSFETs," IEEE Trans. On Electron Devices, vol. 53, No. 10, pp. 2582-2588 (Oct. 2006).

(Continued)

*Primary Examiner* — Long Pham
(74) *Attorney, Agent, or Firm* — Vazken Alexanian; Michael J. Chang, LLC

(57) ABSTRACT

Graphene- and/or carbon nanotube-based radiation-hard transistor devices and techniques for the fabrication thereof are provided. In one aspect, a method of fabricating a radiation-hard transistor is provided. The method includes the following steps. A radiation-hard substrate is provided. A carbon-based material is formed on the substrate wherein a portion of the carbon-based material serves as a channel region of the transistor and other portions of the carbon-based material serve as source and drain regions of the transistor. Contacts are formed to the portions of the carbon-based material that serve as the source and drain regions of the transistor. A gate dielectric is deposited over the portion of the carbon-based material that serves as the channel region of the transistor. A top-gate contact is formed on the gate dielectric.

7 Claims, 6 Drawing Sheets

(51) Int. Cl.
  *H01L 29/66* (2006.01)
  *H01L 29/786* (2006.01)

(56) References Cited

U.S. PATENT DOCUMENTS

| | | | |
|---|---|---|---|
| 5,420,443 | A | 5/1995 | Dreifus et al. |
| 6,607,947 | B1 | 8/2003 | Zhang et al. |
| 7,598,516 | B2 | 10/2009 | Avouris et al. |
| 7,732,859 | B2 * | 6/2010 | Anderson et al. ............ 257/328 |
| 2004/0130775 | A1 | 7/2004 | Grebinski et al. |
| 2004/0238887 | A1 | 12/2004 | Nihey |
| 2009/0008629 | A1 | 1/2009 | Matsumoto et al. |
| 2009/0079040 | A1 | 3/2009 | Schultz et al. |
| 2009/0203176 | A1 | 8/2009 | Kakehata |
| 2009/0224230 | A1 | 9/2009 | Pesetski et al. |
| 2010/0001267 | A1 | 1/2010 | Manning et al. |
| 2010/0102298 | A1 | 4/2010 | Wu |
| 2010/0200840 | A1 | 8/2010 | Anderson et al. |

OTHER PUBLICATIONS

Cho et al., "Electrical Properties of Low-Temperature-Grown CaF2 on Si(111)," Appl. Phys. Lett. 60(3), pp. 338-340 (Jan. 1992).

da Silva et al., "Radiation Response of MOS Capacitors Containing Fluorinated Oxides," IEEE Trans. On Nuclear Science, vol. NS-34, No. 6, pp. 1190-1195 (Dec. 1987).

Lien et al., "Growth of Epitaxial 3C-SiC Films on Si(100) via Low Temperature SiC Buffer Layer," Crystal Growth and Design Communication, vol. 10, pp. 36-39 (2010) (published Dec. 2009).

Nishioka et al., "Radiation Characteristics of Epitaxial CaF2 on Silicon," IEEE Transactions on Nuclear Science, vol. 38, No. 6, pp. 1265-1270 (Dec. 1991).

\* cited by examiner

US 9,064,776 B2

RADIATION HARDENED TRANSISTORS BASED ON GRAPHENE AND CARBON NANOTUBES

CROSS-REFERENCE TO RELATED APPLICATIONS

This application is a divisional of U.S. application Ser. No. 13/006,081 filed on Jan. 13, 2011, now U.S. Pat. No. 8,546, 246, the contents of which are incorporated herein by reference.

FIELD OF THE INVENTION

The present invention relates to radiation-hard transistor devices, and more particularly, to graphene- and/or carbon nanotube-based radiation-hard transistor devices and techniques for the fabrication thereof.

BACKGROUND OF THE INVENTION

The operation of conventional silicon (Si)-based transistor devices is usually severely affected by the impact of radiation, in particular high-energy particles such as photons, heavy ions, neutrons, protons and electrons, resulting in occurrences of single-event upset, single-event latchup, single-event burnout, gamma-dot upset, total-dose exposure, etc. These effects significantly degrade the performance reliability of the devices and circuits operating in certain critical environments, e.g., in nuclear power plants, outer space missions, or other occasions where there exists prevalent exposure to ionizing radiations.

Devices built on silicon-on-insulator (SOI) wafers exhibit better radiation hardness than their bulk-Si counterparts given that a buried oxide (BOX) insulator layer prevents the charges generated in the substrate from being collected by the junctions of the SOI devices. However, electrons can still be produced within the active SOI film (even though the film is relatively thin, i.e., typically from about 80 nanometers (nm) to about 150 nm in radiation-hard applications) which makes the SOI devices subject to potential radiation damage. Moreover, in order to improve the reliability of electronic circuits operating under these harsh environments, additional redundancy in circuit design for error correction is usually required, which increases the cost and circuit complexity.

It would seem then that using a thinner active SOI film would produce better radiation-hard devices. However, in SOI devices, the carrier mobility degrades dramatically as the Si channel thickness decreases, thus compromising the device performance. See, for example, Tsutsui et al., "Mobility and Threshold-Voltage Comparison Between (110)- and (100)-Oriented Ultrathin-Body Silicon MOSFETs," IEEE Trans. On Electron Devices, vol. 53, no. 10, pgs. 2582-2588 (2006). In addition, the present-day fabrication of SOI wafers involves either the high temperature (about 1,100 degrees Celsius (° C.)) bond-strengthening anneal as in Smart Cut wafers or the ion implantation as used in the production of SIMOX (Separation by Implanted Oxygen). Both methods lead to considerable amounts of defects, i.e., oxygen vacancies (on the order of $10^{12}/cm^2$), in the BOX that can trap radiation-generated electrons and holes.

Therefore, radiation-hard transistor devices that do not experience the above-described drawbacks would be desirable.

SUMMARY OF THE INVENTION

The present invention provides graphene- and/or carbon nanotube-based radiation-hard transistor devices and techniques for the fabrication thereof. In one aspect of the invention, a method of fabricating a radiation-hard transistor is provided. The method includes the following steps. A radiation-hard substrate is provided. A carbon-based material is formed on the substrate wherein a portion of the carbon-based material serves as a channel region of the transistor and other portions of the carbon-based material serve as source and drain regions of the transistor. Contacts are formed to the portions of the carbon-based material that serve as the source and drain regions of the transistor. A gate dielectric is deposited over the portion of the carbon-based material that serves as the channel region of the transistor. A top-gate contact is formed on the gate dielectric.

In another aspect of the invention, a radiation-hard transistor is provided. The radiation-hard transistor includes a radiation-hard substrate; a carbon-based material on the substrate wherein a portion of the carbon-based material serves as a channel region of the transistor and other portions of the carbon-based material serve as source and drain regions of the transistor; contacts formed to the portions of the carbon-based material that serve as the source and drain regions of the transistor; a gate dielectric disposed over the portion of the carbon-based material that serves as the channel region of the transistor; and a top-gate contact on the gate dielectric.

A more complete understanding of the present invention, as well as further features and advantages of the present invention, will be obtained by reference to the following detailed description and drawings.

DETAILED DESCRIPTION OF PREFERRED EMBODIMENTS

Figure 1:
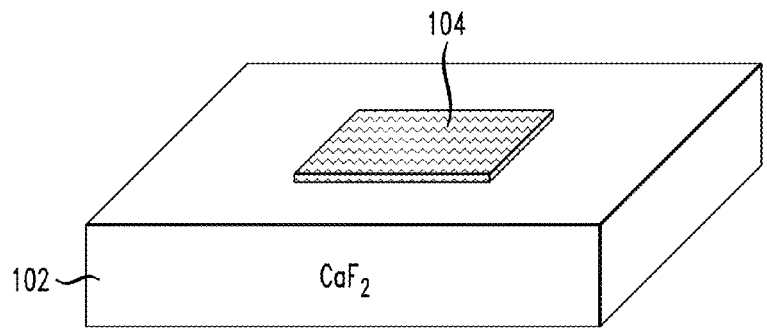
FIG. 1 is a three-dimensional diagram illustrating a carbon-based material having been formed (i.e., deposited or grown) on a radiation-hardened calcium fluoride ($CaF_2$) substrate and trimmed to remove carbon-based materials outside of the area of interest according to an embodiment of the present invention.

Provided herein are radiation-hard transistor devices that do not experience the above-described problems associated with radiation and bulk silicon (Si) or silicon-on-insulator (SOI) devices. Namely, as will be described in detail below, the present transistor devices employ carbon-based materials, such as graphene and/or carbon nanotubes, and are built on radiation-hard substrates. Both of these features contribute to the radiation hardness of the present devices. Several different radiation-hard substrate configurations may be employed in accordance with the present teachings.

FIGS. 1-5 illustrate a process for fabricating the present devices using one exemplary radiation-hard substrate configuration, i.e., a calcium fluoride ($CaF_2$) substrate. FIGS. 6-10 illustrate the device fabrication process using a different exemplary radiation-hard substrate configuration, i.e., a Si wafer covered with a radiation hard material (such as $CaF_2$ or fluorinated silicon dioxide ($SiO_2$)) or a radiation-hardened material (such as a thermally-annealed silicon carbide (SiC) film). Each of these embodiments will now be described in detail.

To begin the fabrication process, the particular radiation-hard/radiation-hardened substrate is provided. In the example shown in FIG. 1, radiation-hard substrate 102 is a $CaF_2$ film. $CaF_2$ materials are commercially available in various sizes and thicknesses. The electrical properties of $CaF_2$ films are discussed, for example, in Cho et al., "Electrical Properties of Low-Temperature-Grown $CaF_2$ on Si(111)," Appl. Phys. Lett. 60(3), pgs. 338-340 (1992), the contents of which are incorporated by reference herein. A $CaF_2$ film exhibits improved radiation response, including a lower amount of radiation-induced oxide charges and interface traps, less change in dielectric constant and less reduction in breakdown voltage under irradiation as compared to conventional oxide substrates such as $SiO_2$. The relatively better radiation hardness of $CaF_2$ may be due to a stronger bonding between the calcium (Ca) and fluorine (F) atoms as compared to the bonding between the Si and oxygen (O) atoms in $SiO_2$. Such robust bonding strength in $CaF_2$ leads to fewer defects or surface dangling bonds, which are the major sources of radiation reduced charges. According to the present techniques, $CaF_2$ alone can be employed as the radiation-hard substrate (as in this present example), or as an epitaxial film grown on a Si wafer (see description of FIGS. 6-10, below).

Next, a carbon-based material 104 is formed (i.e., deposited or grown) on radiation-hard substrate 102 and trimmed to the desirable dimension and geometry using lithography and oxygen plasma. The device can contain one or more transistors, and carbon-based material 104 will be used to form a channel region and source and drain regions of each of the transistor(s) (see below). According to an exemplary embodiment, carbon-based material 104 is a graphene and/or carbon nanotube film which includes a single layer or multiple layers (e.g., up to a few monolayers) of graphene and/or carbon nanotubes. Depending on the function and the purpose of the device, graphene alone or carbon nanotubes alone can be used to form the channel/source and drain regions of the transistor(s). Alternatively, a combination of graphene and carbon nanotubes can also be used to create a hybrid circuit. For instance, in the hybrid circuit, certain transistors may employ carbon nanotubes as the channel/source and drain material where a high current on/off switching ratio is required, while other transistors may employ graphene as the channel/source and drain material where a high electrical current density and carrier mobility is desirable. In the hybrid circuit, graphene and carbon nanotubes may be deposited or grown separately and placed side by side to provide their respective functionality.

Graphene is a layer of carbon atoms arranged in a hexagonal network, where carbon atoms are bonded by sp2 hybridization. Carbon nanotubes are rolled-up graphene sheets with diameters ranging from about 1 nanometer (nm) to about 10 nm. The structures of graphene and carbon nanotubes are expected to be robust against irradiation because of the high binding energy between carbon atoms (about 7.3 electron volts (eV)). In addition, the ultra-small thickness, i.e., only one-atom thick, of graphene and carbon nanotubes minimizes the scattering cross-section for energetic incident particles. Therefore, graphene and carbon nanotubes offer unique advantages for radiation-hard applications.

Graphene and carbon nanotubes can be grown directly on radiation-hard substrate 102 by, e.g., chemical vapor deposition (CVD), or produced elsewhere and transferred to radiation-hard substrate 102. The techniques for depositing, growing and/or transferring graphene and carbon nanotube materials are known to those of skill in the art and thus are not described further herein.

Figure 2:
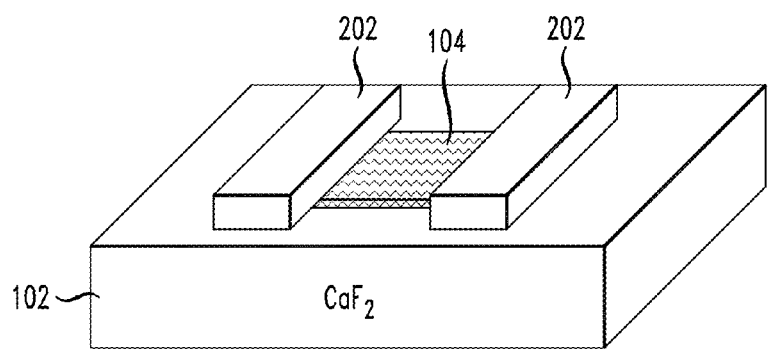
FIG. 2 is a three-dimensional diagram illustrating contacts having been formed on portions of the carbon-based material that serve as source and drain regions according to an embodiment of the present invention.

In general, each transistor includes a channel region interconnecting a source region and a drain region, and a gate separated from the channel region by a dielectric (gate dielectric) material. The transistors described herein are top-gated transistors, and a portion of the carbon-based material under the top-gate contact serves as a channel region of the transistor while other portions of the carbon-based material extending laterally out from under the top-gate contact serve as source and drain regions of the transistor. As shown in FIG. 2, contacts 202 are formed on the portions of the carbon-based material that serve as the source and drain regions of the transistor. According to an exemplary embodiment, contacts 202 are formed by depositing a suitable source/drain metal(s) using lithography and lift-off techniques. These techniques are known to those of skill in the art and thus are not described further herein. For ease of depiction, the formation of a single transistor is shown in FIGS. 1-5, with the understanding that multiple transistors may be formed in the same manner, if desired. Any excess graphene/carbon nanotubes outside of the channel or source/drain regions may be removed using lithography and oxygen plasma etching.

Figure 3:
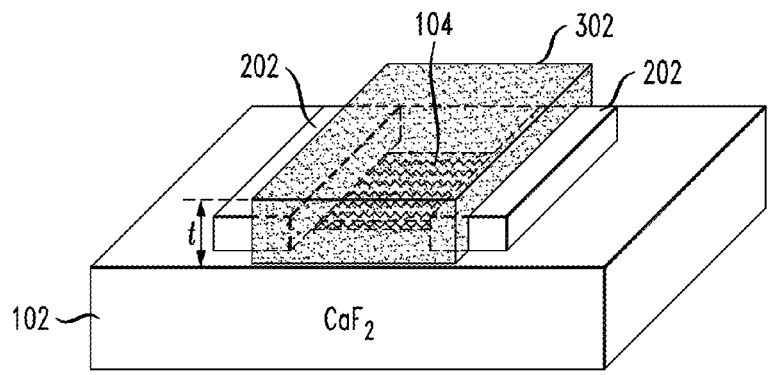
FIG. 3 is a three-dimensional diagram illustrating a gate dielectric having been deposited over a portion of the carbon-based material that serves as a channel region according to an embodiment of the present invention.

As shown in FIG. 3, a layer of a gate dielectric 302 is then deposited over exposed portions of carbon-based material 104 including the portion of carbon-based material 104 that serves as the channel region of the transistor. Examples of suitable gate dielectrics include, but are not limited to, aluminum oxide, hafnium oxide, silicon oxide and zirconium oxide. According to an exemplary embodiment, gate dielectric 302 is deposited to a thickness t of from about 1 nm to about 20 nm. In this thickness range, the radiation damage and charge generation in the gate dielectric is expected to be insignificant. As shown in FIG. 3, gate dielectric 302 may also cover at least a portion of each of contacts 202. In certain situations, it may be necessary to cover portions of the source and drain contacts (e.g., with the gate dielectric) if the gate is designed to overlap portions of the source and drain contacts in order to ensure effective electrostatic gate control over the entire channel region between the source and drain.

Figure 4:
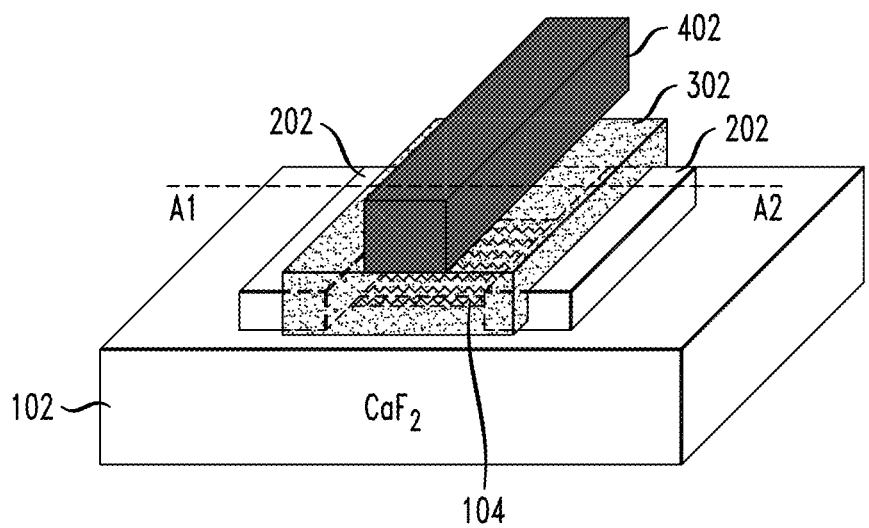
FIG. 4 is a three-dimensional diagram illustrating a metal top-gate contact having been formed on the gate dielectric over the portion of the carbon-based material that serves as the channel region according to an embodiment of the present invention.

Finally, as shown in FIG. 4, a top-gate contact 402 is formed on gate dielectric 302 over the portion of carbon-based material 104 that serves as the channel region of the transistor. With this configuration, the placement of top-gate contact 402 also defines the source and drain regions of the transistor, namely those portions of the carbon-base material 104 extending laterally out from under gate contact 402. Top-gate contact 402 will modulate conduction through the channel region. According to an exemplary embodiment, top-gate contact 402 is formed by depositing a suitable gate metal on gate dielectric 302 using lithography and lift-off. These processes for forming a metal gate contact are known to those of skill in the art and thus are not described further herein.

Figure 5:
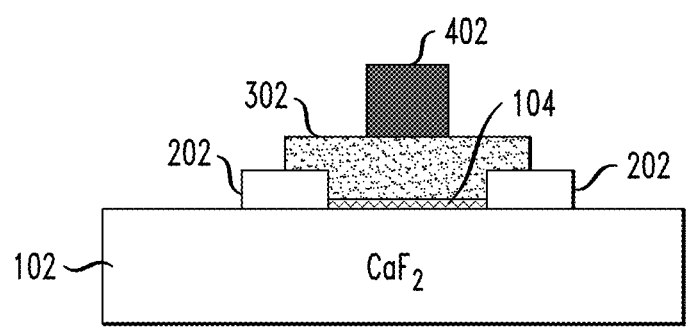
FIG. 5 is a diagram illustrating a cross-sectional cut through the structure of FIG. 4 according to an embodiment of the present invention.
Figure 6:
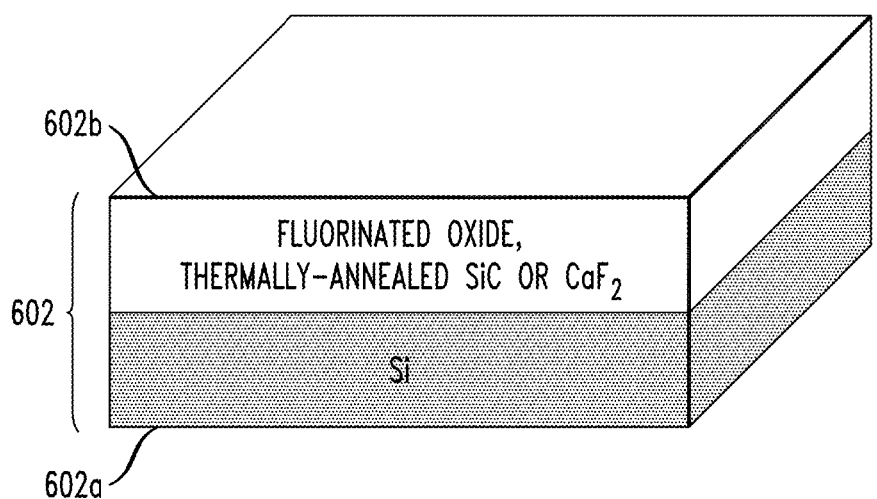
FIG. 6 is a three-dimensional diagram illustrating a radiation-hard substrate having a silicon (Si) wafer covered with a layer of a radiation-hard material according to an embodiment of the present invention.

FIG. 5 depicts a cross-sectional cut through the structure of FIG. 4, i.e., along line A1-A2. In the exemplary embodiment shown in FIG. 5, top-gate contact 402 does not overlap source and drain region contacts 202. This configuration may also be referred to as an underlapping gate design.

As highlighted above, the present radiation-hard/radiation-hardened transistor devices may also be fabricated on a substrate consisting of an Si wafer covered with a layer of a radiation-hard/radiation-hardened material. This process is now described in detail with reference to FIGS. 6-10.

To begin the fabrication process, the particular radiation-hard substrate is provided. In the example shown in FIG. 6, radiation-hard substrate 602 includes a Si wafer 602a covered with a layer of a radiation-hard material 602b. In one exemplary embodiment, radiation-hard material 602b is a fluorinated $SiO_2$ film. As an example, a fluorinated $SiO_2$ film can be formed on Si wafer 602a by oxidizing Si wafer 602a in the presence of diluted nitrogen trifluoride ($NF_3$) gases. See, for example, da Silva et al., "Radiation Response of MOS Capacitors Containing Fluorinated Oxides," IEEE Trans. On Nuclear Science, vol. NS-34, No. 6, pgs. 1190-1195 (December 1987), the contents of which are incorporated by reference herein. A fluorinated $SiO_2$/Si substrate exhibits improved radiation response, including a lower amount of radiation-induced oxide charges and interface traps, less change in dielectric constant and less reduction in break-down voltage under irradiation as compared to conventional oxide substrates such as $SiO_2$. The radiation hardness of fluorinated $SiO_2$ can be further improved through an "aging" process, which involves storing the fluorinated $SiO_2$ at room temperature for an extended period of time, e.g., from about 3 hours to about 100 hours. In addition, the aging process can be accelerated by keeping the sample in an environment with elevated temperatures, e.g., temperatures up to about 75 degrees Celsius (° C.).

In another exemplary embodiment, the layer of radiation-hard material 602b is a SiC film that has been thermally annealed. Thermally annealing a SiC film increases its radiation hardness. See, for example, U.S. Pat. No. 5,156,784 issued to Fuentes, entitled "Method for Fabricating a Silicon Carbide Film to Provide Improved Radiation Hardness," the contents of which are incorporated by reference herein, wherein it is described that annealing an SiC film at 1,250° C. for two hours can serve to significantly enhance the radiation hardness of the SiC.

As an example, a SiC film can be epitaxially grown on Si wafer 602a. The process for growing epitaxial SiC on a Si wafer is known to those of skill in the art and thus is not described further herein. Once grown, the SiC film is thermally annealed, e.g., at a temperature of from about 1,200° C. to about 1,600° C., e.g., at about 1,250° C., for a duration of from about 1 hour to about 3 hours, to increase its radiation hardness. Optionally, oxygen reactive ion etching ($O_2$ RIE) can be used to remove any graphitic by-products from the SiC film/Si wafer left by the anneal. A thermally-annealed SiC film exhibits improved radiation response, including a lower amount of radiation-induced charges and interface traps from anneal-mediated low stress, less change in dielectric constant and less reduction in break-down voltage under irradiation as compared to conventional oxide substrates such as $SiO_2$.

It is also possible to employ a commercially available SiC-containing substrate in the process. In such commercially available substrates, the SiC film is typically present on a sapphire wafer or as a standalone substrate. The SiC film can be processed in the same manner as described above. Namely, the SiC film can be thermally annealed, e.g., at a temperature of from about 1,200° C. to about 1,600° C., e.g., at about 1,250° C. for a duration of from about 1 hour to about 3 hours, to increase its radiation hardness followed by an $O_2$ RIE to remove any graphitic by-products left from the anneal.

In yet another exemplary embodiment, the layer of radiation-hard material 602b is epitaxial $CaF_2$. Namely, as highlighted above, either $CaF_2$ alone, or as a film epitaxially grown on a Si wafer (e.g., Si wafer 602a) may be used as the radiation hard material in the present devices. The process for growing epitaxial $CaF_2$ on a Si wafer is known to those of skill in the art and thus is not described further herein. The benefits of $CaF_2$ with regard to radiation-hardness were described above. Further advantageously, when $CaF_2$ is grown epitaxially on Si, the fluorine at the $CaF_2$/Si interface may help mitigate the interfacial strain in Si and further improve the radiation hardness.

Figure 7:
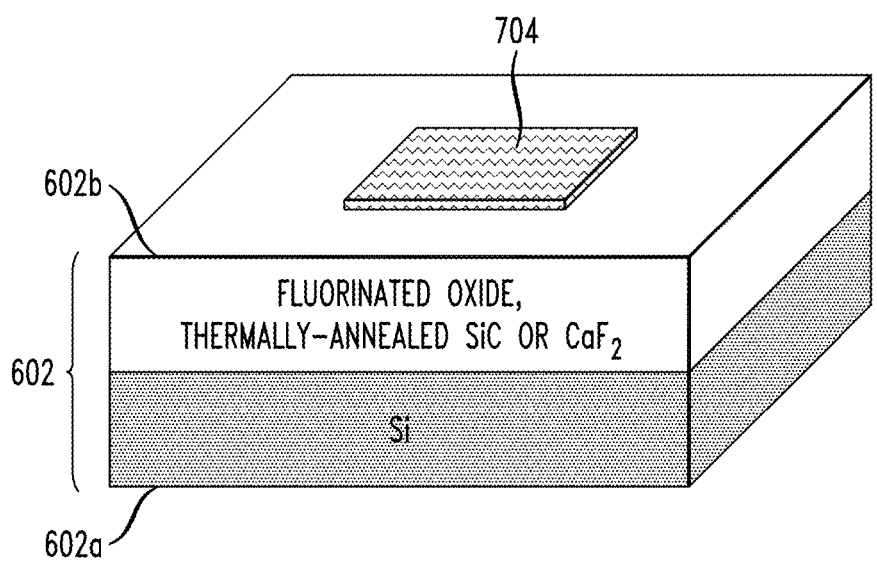
FIG. 7 is a three-dimensional diagram illustrating a carbon-based material having been formed on the radiation-hard substrate of FIG. 6 and trimmed to remove any carbon-based materials outside of the region of interest according to an embodiment of the present invention.

Next, as shown in FIG. 7 a carbon-based material 704 is formed (i.e., deposited or grown) on radiation-hard substrate 602 and trimmed to the desirable dimension and geometry using lithography and oxygen plasma. According to an exemplary embodiment, carbon-based material 704 is a graphene and/or carbon nanotube film which includes a single layer or multiple layers (e.g., up to a few monolayers) of graphene and/or carbon nanotubes.

As described above, the structures of graphene and carbon nanotubes are expected to be robust against irradiation because of the high binding energy between carbon atoms (about 7.3 eV). In addition, the ultra-small thickness, i.e., only one-atom thick, of graphene and carbon nanotubes minimizes the scattering cross-section for energetic incident particles. Therefore, graphene and carbon nanotubes offer unique advantages for radiation-hardened applications.

The method by which carbon-based material 704 is formed on radiation-hard substrate 602 can vary depending on the particular radiation-hard material being employed. When, as described above, radiation-hard material 602b is a fluorinated $SiO_2$ or $CaF_2$ layer, graphene and/or carbon nanotubes can be deposited on the layer of radiation-hard material 602b by CVD, or produced elsewhere and transferred onto the layer of radiation-hard material 602b. The techniques for depositing, growing and/or transferring graphene and carbon nanotubes are known to those of skill in the art and thus are not described further herein.

When, as described above, radiation-hard material 602b is a thermally-annealed SiC film, graphene and/or carbon nanotubes can be deposited on the layer of radiation-hard material 602b by CVD, or produced elsewhere and transferred onto the layer of radiation-hard material 602b, as above. Alternatively, graphene can be grown from the radiation-hardened SiC film. By way of example only, the SiC film can be heated to decompose the SiC into silicon and carbon atoms. The silicon atoms sublimate leaving behind a carbon-rich surface which can re-assemble itself into one or more graphene layers. This exemplary embodiment for growing graphene from an epitaxial SiC film is further detailed in FIGS. 11-14, described below.

Figure 8:
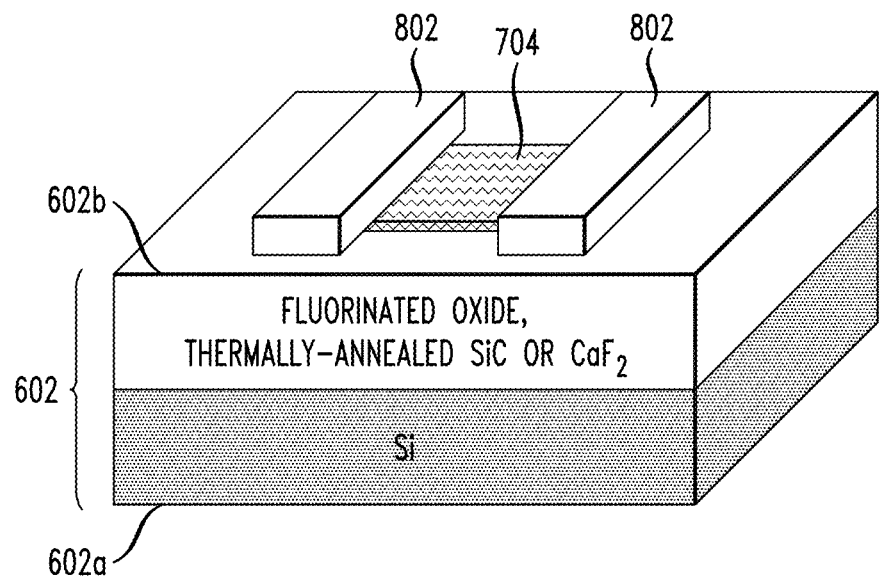
FIG. 8 is a three-dimensional diagram illustrating contacts having been formed on portions of the carbon-based material that serve as source and drain regions according to an embodiment of the present invention.

As in the embodiments described above, the carbon-based material forms channel and source/drain regions of the transistor. Namely, the portion of the carbon-based material under a top-gate contact serves as a channel region of the transistor, while portions of the carbon-based material extending laterally out from under the top-gate contact serve as source and drain regions of the transistor. As shown in FIG. 8, contacts 802 are formed on the portions of the carbon-based material that serve as source and drain regions of the transistor. According to an exemplary embodiment, contacts 802 are formed by depositing a suitable source/drain metal(s) using lithography and lift-off techniques. These techniques are known to those of skill in the art and thus are not described further herein. Any excess graphene/carbon nanotubes outside of the channel or source/drain regions may be removed using lithography and oxygen plasma etching.

Figure 9:
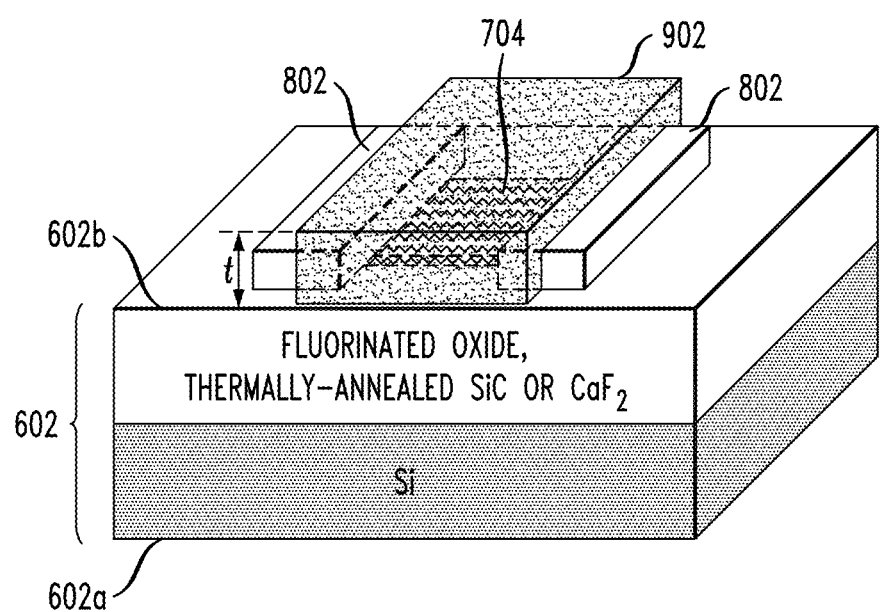
FIG. 9 is a three-dimensional diagram illustrating a gate dielectric having been deposited over a portion of the carbon-based material that serves as a channel region according to an embodiment of the present invention.

As shown in FIG. 9, a layer of a gate dielectric 902 is then deposited over exposed portions of carbon-based material 704 including the portion of carbon-based material 704 that serves as the channel region of the transistor. Examples of suitable gate dielectrics include, but are not limited to, aluminum oxide, hafnium oxide, silicon oxide and zirconium oxide. According to an exemplary embodiment, gate dielectric 902 is deposited to a thickness t of from about 1 nm to about 20 nm. In this thickness range, the radiation damage and charge generation in the gate dielectric is expected to be insignificant. As shown in FIG. 9, gate dielectric 902 may also cover at least a portion of source and drain contacts 802. As described above, in certain situations, it may be necessary to cover portions of the source and drain contacts (e.g., with the gate dielectric) if the gate is designed to overlap portions of the source and drain contacts to ensure effective electrostatic gate control over the entire channel region between the source and drain.

Figure 10:
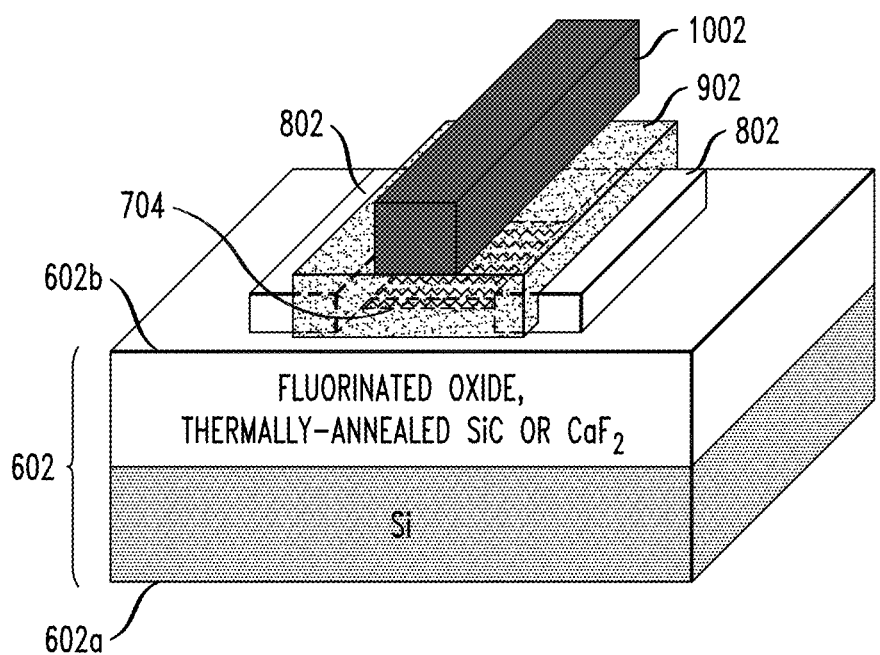
FIG. 10 is a three-dimensional diagram illustrating a metal top-gate contact having been formed on the gate dielectric over the portion of the carbon-based material that serves as the channel region according to an embodiment of the present invention

Finally, as shown in FIG. 10, a top-gate contact 1002 is formed on gate dielectric 902 over the portion of carbon-based material 704 that serves as the channel region of the transistor. With this configuration, the placement of top-gate contact 1002 also defines the source and drain regions of the transistor, namely those portions of the carbon-base material 704 extending laterally out from under gate contact 1002. Top-gate contact 1002 will modulate conduction through the channel region. According to an exemplary embodiment, top-gate contact 1002 is formed by depositing a suitable gate metal on gate dielectric 902 using lithography and lift-off. These processes for forming a metal gate contact are known to those of skill in the art and thus are not described further herein. For ease of depiction, the formation of a single transistor is shown in FIGS. 6-10, with the understanding that multiple transistors may be formed in the same manner, if desired.

Transistors produced in the manner described herein can be immune to the impact of radiation while at the same time maintain high carrier mobility to enable high-performance applications. Namely, by combining the radiation-hard substrate and graphene and/or carbon nanotubes as the transistor channel, the resulting device structure is expected to exhibit superior radiation response.

Figure 11:
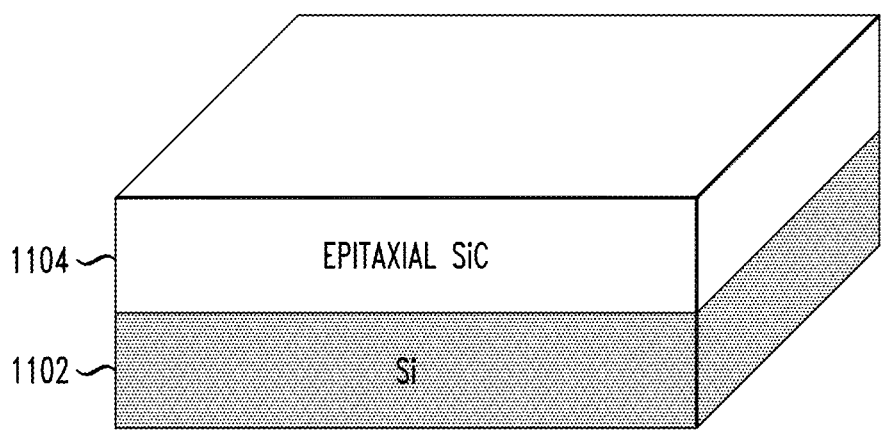
FIG. 11 is a three-dimensional diagram illustrating a Si wafer having an epitaxial silicon carbide (SiC) film formed thereon according to an embodiment of the present invention.
Figure 12:
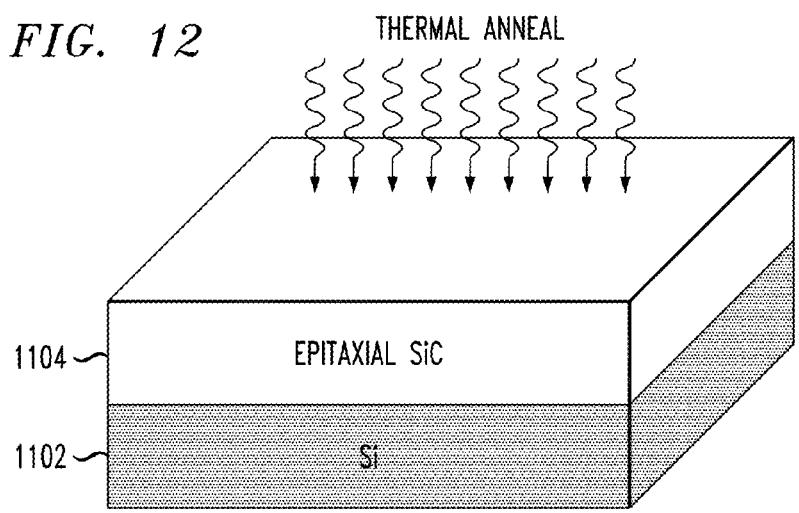
FIG. 12 is a three-dimensional diagram illustrating the SiC film being thermally annealed to form a radiation-hardened SiC film according to an embodiment of the present invention.

FIGS. 11-14 illustrate the exemplary embodiment described above wherein epitaxial thermally annealed SiC is the radiation hardened material and wherein the carbon-based material, in this case graphene, is grown from the SiC material. As shown in FIG. 11, a Si wafer 1102 is provided and a SiC film 1104 is grown from Si wafer 1102. As an example, an epitaxial SiC film can be grown on an Si wafer via a CVD process using methyltrichlorosilane at 1,200° C. See, for example, Lien et al., "Growth of Epitaxial 3C—SiC Films on Si(100) via Low Temperature SiC Buffer Layer," Crystal Growth and Design Communication, vol. 10, pgs. 36-39 (2010), the contents of which are incorporated by reference herein.

SiC film 1104 is then thermally annealed. See FIG. 12. As described above, thermally annealing an SiC film at a temperature of from about 1,200° C. to about 1,600° C., e.g., at about 1,250° C., for a duration of from about 1 hour to about 3 hours increases the radiation-hardness of the film. An $O_2$ RIE can then be used to remove any graphitic by-products from the anneal, as described above.

Figure 13:
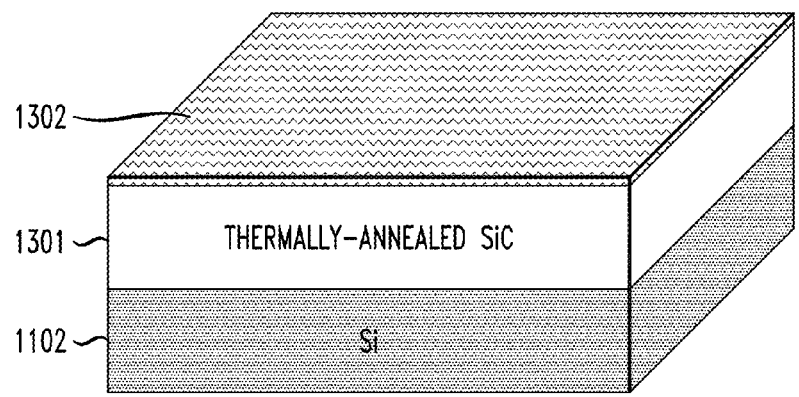
FIG. 13 is a three-dimensional diagram illustrating the radiation-hardened SiC film having been used to grow graphene according to an embodiment of the present invention.
Figure 14:
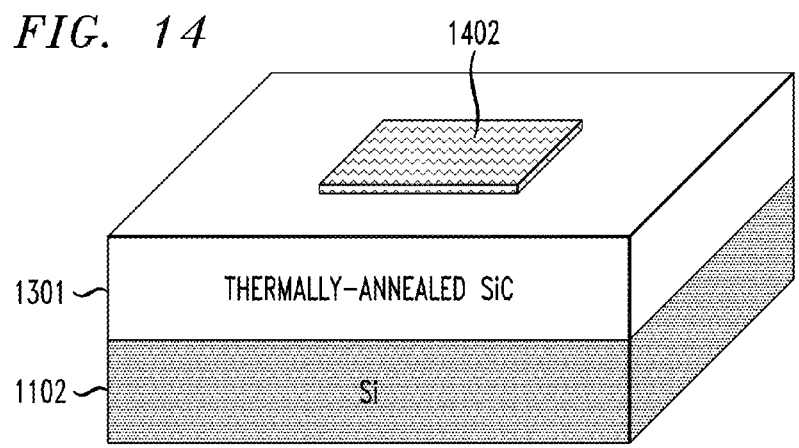
FIG. 14 is a three-dimensional diagram illustrating the graphene having been trimmed according to an embodiment of the present invention.

As shown in FIG. 13, the radiation-hardened SiC film now given reference numeral 1301 so as to distinguish the radiation-hardened SiC film from the pre-annealed film is then used to grow one or more graphene layers 1302. For example, heating the SiC film at a temperature of from about 1,200° C. to about 1,600° C. will cause the SiC to decompose into its respective silicon and carbon atoms. The silicon atoms will sublimate and the carbon left behind can rearrange itself into one or more graphene layers 1302. As shown in FIG. 13, the graphene formed will likely cover the surface of the SiC film 1301. To localize the graphene, e.g., to an active area of the wafer, lithography and oxygen plasma can be employed to trim the graphene to the desirable dimension and geometry. The result is patterned graphene 1402. See FIG. 14.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A radiation-hard transistor, comprising:
 a radiation-hard substrate, wherein the substrate comprises a silicon wafer covered with a radiation-hard material;
 a carbon-based material on the substrate wherein a portion of the carbon-based material serves as a channel region of the transistor and other portions of the carbon-based material serve as source and drain regions of the transistor;
 contacts formed to the portions of the carbon-based material that serve as the source and drain regions of the transistor;
 a gate dielectric disposed over the portion of the carbon-based material that serves as the channel region of the transistor; and
 a top-gate contact on the gate dielectric.

2. The radiation-hard transistor of claim 1, wherein the radiation-hard material comprises a calcium fluoride film.

3. The radiation-hard transistor of claim 1, wherein the radiation-hard material comprises a fluorinated silicon dioxide film.

4. The radiation-hard transistor of claim 1, wherein the radiation-hard material comprises a silicon carbide film.

5. The radiation-hard transistor of claim 1, wherein the carbon-based material comprises one or more of graphene and carbon nanotubes.

6. The radiation-hard transistor of claim 1, wherein the gate dielectric comprises aluminum oxide, hafnium oxide, silicon oxide or zirconium oxide.

7. A radiation-hard transistor, comprising:
- a radiation-hard substrate, wherein the substrate comprises a calcium fluoride film;
- a carbon-based material on the substrate wherein a portion of the carbon-based material serves as a channel region of the transistor and other portions of the carbon-based material serve as source and drain regions of the transistor;
- contacts formed to the portions of the carbon-based material that serves as the source and drain regions of the transistor;
- a gate dielectric disposed over the portion of the carbon-based material that serves as the channel region of the transistor; and
- a top-gate contact on the gate dielectric.

\* \* \* \* \*